(12) United States Patent
Shibata et al.

(10) Patent No.: US 9,851,502 B2
(45) Date of Patent: Dec. 26, 2017

(54) OPTO-ELECTRIC HYBRID BOARD

(71) Applicant: NITTO DENKO CORPORATION, Ibaraki-shi, Osaka (JP)

(72) Inventors: Naoki Shibata, Ibaraki (JP); Yuichi Tsujita, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/316,940

(22) PCT Filed: Mar. 18, 2015

(86) PCT No.: PCT/JP2015/057974
§ 371 (c)(1),
(2) Date: Dec. 7, 2016

(87) PCT Pub. No.: WO2015/190148
PCT Pub. Date: Dec. 17, 2015

(65) Prior Publication Data
US 2017/0102502 A1   Apr. 13, 2017

(30) Foreign Application Priority Data

Jun. 10, 2014   (JP) .................... 2014-119458

(51) Int. Cl.
*G02B 6/12*   (2006.01)
*G02B 6/43*   (2006.01)
(Continued)

(52) U.S. Cl.
CPC .............. *G02B 6/12* (2013.01); *G02B 6/428* (2013.01); *G02B 6/43* (2013.01);
(Continued)

(58) Field of Classification Search
CPC ...... G02B 6/12; G02B 6/4214; G02B 6/4274; G02B 6/428; H05K 1/0274; H05K 2201/10121
See application file for complete search history.

(56) References Cited

U.S. PATENT DOCUMENTS

| 9,606,312 | B2* | 3/2017 | Nishikawa | ........... G02B 6/4293 |
| 9,703,057 | B2* | 7/2017 | Tsujita | ................... G02B 6/428 |
| 2004/0218848 | A1* | 11/2004 | Shen | ....................... G02B 6/43 385/14 |
| 2010/0316335 | A1 | 12/2010 | Furuyama | |

(Continued)

FOREIGN PATENT DOCUMENTS

| JP | 8-213722 A | 8/1996 |
| JP | 2006-173224 A | 6/2006 |

(Continued)

OTHER PUBLICATIONS

Notification of Transmittal of Translation of the International Preliminary Report on Patentability (Form PCT/IB/338) issued in counterpart International Application No. PCT/JP2015/057974 dated Dec. 22, 2016, with Forms PCT/IB/373 and PCT/ISA/237. (10 pages).

(Continued)

*Primary Examiner* — Daniel Petkovsek
(74) *Attorney, Agent, or Firm* — Westerman, Hattori, Daniels & Adrian

(57) ABSTRACT

An opto-electric hybrid board includes opto-electric module portions respectively defined on opposite end portions of an elongated insulation layer, and an interconnection portion defined on a portion of the insulation layer between the opto-electric module portions and including an optical waveguide. A metal reinforcement layer extends over the opto-electric module portions into the interconnection portion. A portion of the metal reinforcement layer present in the interconnection portion has a smaller width than portions of the metal reinforcement layer present in the opto-electric module portions, and has a discontinuity extending width- (Continued)

wise across the metal reinforcement layer. This arrangement makes it possible to protect the optical waveguide from the bending and the twisting of the interconnection portion, while ensuring the flexibility of the interconnection portion including the optical waveguide.

8 Claims, 8 Drawing Sheets

(51) Int. Cl.
    *H01L 33/62*     (2010.01)
    *G02B 6/42*     (2006.01)
    *H01L 31/0232*     (2014.01)
    *H05K 1/02*     (2006.01)

(52) U.S. Cl.
    CPC ........ *H01L 31/02325* (2013.01); *H01L 33/62* (2013.01); *H05K 1/0274* (2013.01); *H05K 1/02* (2013.01); *H05K 2201/10121* (2013.01)

(56) References Cited

U.S. PATENT DOCUMENTS

| | | |
|---|---|---|
| 2012/0237158 A1 | 9/2012 | Inoue et al. |
| 2013/0243370 A1 | 9/2013 | Tsujita et al. |
| 2014/0064668 A1 | 3/2014 | Nishikawa et al. |
| 2016/0266338 A1* | 9/2016 | Shibata ................ G02B 6/4214 |

FOREIGN PATENT DOCUMENTS

| | | |
|---|---|---|
| JP | 2010-286777 A | 12/2010 |
| JP | 2011-221143 A | 11/2011 |
| JP | 2012-185420 A | 9/2012 |
| JP | 2012-194401 A | 10/2012 |
| JP | 2013-195533 A | 9/2013 |
| JP | 2015-87633 A | 5/2015 |

OTHER PUBLICATIONS

International Search Report dated Jun. 16, 2015, issued in counterpart International Application No. PCT/JP2015/057974 (2 pages).

* cited by examiner

OPTO-ELECTRIC HYBRID BOARD

TECHNICAL FIELD

The present invention relates to an opto-electric hybrid board including an opto-electric module portion and an interconnection portion.

BACKGROUND ART

In recent electronic devices and the like, optical wirings are employed in addition to electric wirings to cope with increase in information transmission amount. With a trend toward size reduction of the electronic devices and the like, there is a demand for a wiring board which has a smaller size and a higher integration density so as to be mounted in a limited space. For example, an opto-electric hybrid board as shown in FIG. 7A is proposed as such a wiring board, in which an opto-electric module portion E including an electric wiring 13 of an electrically conductive pattern and an optical element 10 mounted on pads 13a is provided on each (or one of opposite end portions of a front surface of an insulation layer 12 such as of a polyimide, and an optical waveguide W including an under-cladding layer 20, a core 21 and an over-cladding layer 22 is provided on a back surface of the insulation layer 12 (see, for example, PTL 1).

In the opto-electric hybrid board, an optical signal transmitted through the core 21 of the optical waveguide W as indicated by a one-dot-and-dash line P in FIG. 7A is converted into an electric signal by the optical element 10 of the opto-electric module portion E for electrical control. Further, an electric signal transmitted through the electric wiring 13 is converted into an optical signal by the optical element 10. The optical signal is transmitted through the optical waveguide W to another opto-electric module portion (not shown) provided on an opposite side, and taken out as an electric signal again.

In the opto-electric hybrid board, the insulation layer (such as of the polyimide) 12 contacts the optical waveguide (such as of an epoxy resin) W. Therefore, the optical waveguide W is liable to be stressed or slightly warped due to a difference in linear expansion coefficient between the insulation layer 12 and the optical waveguide W by an ambient temperature. Problematically, this increases the light transmission loss of the optical waveguide W. When the optical element for the optical-to-electric signal conversion and the electric-to-optical signal conversion and an IC for driving the optical element are to be mounted on the opto-electric module portion E, a mount surface of the opto-electric module portion E is liable to be unstable without provision of a reinforcement layer. Therefore, it will be impossible to properly mount the optical element and the IC on the opto-electric module portion E or, if possible, the opto-electric module portion E will fail to establish a sufficiently reliable connection.

To cope with this, it is proposed to provide a metal reinforcement layer 11 such as a stainless steel layer on the back surface of the insulation layer 12 to impart the opto-electric module portion E with a certain level of rigidity, whereby the stress and the slight warpage of the optical waveguide W are prevented to suppress the increase in light transmission loss. Without provision of such a metal reinforcement layer 11 in an interconnection portion of the opto-electric hybrid board other than the opto-electric module portion E, it is possible to ensure the flexibility of the optical waveguide W, so that the opto-electric hybrid board can be mounted in a smaller space to establish optical and electrical connections in a complicated positional relationship.

RELATED ART DOCUMENT

Patent Document

PTL 1: JP-A-2012-194401

SUMMARY OF INVENTION

In an opto-electric hybrid board in which opto-electric module portions E, E' each reinforced with a metal reinforcement layer 11 are connected to an interconnection portion B including a flexible optical waveguide W, as schematically shown in FIG. 7B, the optical waveguide W (indicated by rough hatching) extends from portions of the opto-electric hybrid board each provided with the metal reinforcement layer 11 (regions indicated by fine hatching) to a portion of the opto-electric hybrid board not provided with the metal reinforcement layer 11. Therefore, the optical waveguide W is liable to be stretched and twisted by the highly rigid metal reinforcement layers 11 at boundaries X, X' between the opto-electric module portions and the interconnection portion whenever the optical waveguide W is moved. Thus, the optical waveguide W is liable to be torn or folded at the boundaries.

It is recently proposed to reduce the width of the interconnection portion B as shown in FIG. 7C in order to increase the flexibility of the opto-electric hybrid board. Further, it is contemplated that the metal reinforcement layers 11 are configured so as to partly project into the interconnection portion in order to increase the strength of the boundaries between the opto-electric module portions E, E' and the interconnection portion B. Even if the metal reinforcement layers each have this configuration, the optical waveguide W is liable to be torn or folded along boundaries Y, Y' between metal reinforcement layer present regions and a metal reinforcement layer absent region as in the aforementioned case. In addition, the optical waveguide W is liable to be stressed or damaged at width reduction corner portions Z, Z' by the warpage and the twisting of the metal reinforcement layers 11.

To cope with this, the inventor of the present invention conducted studies on an opto-electric hybrid board configured so that the interconnection portion B is flexible and the optical waveguide W is not badly stressed at the boundaries between the metal reinforcement layer present regions and the metal reinforcement layer absent region (for which a patent application (Japanese Patent Application No. 2013-227368) was already filed to the Japan Patent Office on Oct. 31, 2013).

In this opto-electric hybrid board, as shown in FIG. 8, a metal reinforcement layer 11 extends from the interconnection portion B to the left and right opto-electric module portions E, E'. A portion of the metal reinforcement layer 11 present in the interconnection portion B has a smaller width than portions of the metal reinforcement layer 11 present in the opto-electric module portions E, E', and the smaller width portion of the metal reinforcement layer 11 has rounded proximal corner portions. With this arrangement, the interconnection portion B having a smaller width is reinforced with the metal reinforcement layer 11. Even if the interconnection portion B is bent or twisted, therefore, a bent or twisted part of the interconnection portion B is advantageously prevented from being broken or badly folded.

Where the left and right opto-electric module portions E, E' and the interconnection portion B provided between the opto-electric module portions E and E' are reinforced with the unitary metal reinforcement layer 11 as shown in FIG. 8, however, the left and right opto-electric module portions E, E' share noise occurring in either of the opto-electric module portions E, E', because the portions of the metal reinforcement layer 11 present in the left and right opto-electric module portions E, E' serve as GNDs (grounds) and are connected to each other. Therefore, electric circuits of the opto-electric module portions E, E' require improvement.

In view of the foregoing, it is an object of the present invention to provide an excellent opto-electric hybrid board which includes a sufficiently flexible interconnection portion including an optical waveguide protected from the bending and the twisting of the interconnection portion, and is substantially free from increase in light transmission loss and less susceptible to noises.

According to a first inventive aspect to achieve the aforementioned object, there is provided an opto-electric hybrid board, which includes: an elongated insulation layer; an opto-electric module portion defined on at least one end portion of the insulation layer; an interconnection portion defined on a portion of the insulation layer extending from the opto-electric module portion; and a metal reinforcement layer provided on a back surface of the insulation layer as extending over the opto-electric module portion into the interconnection portion; wherein the opto-electric module portion includes a first electric wiring of an electrically conductive pattern provided on a front side thereof, and an optical element provided on the front side thereof; wherein an elongated optical waveguide is provided on a back side of the interconnection portion and is optically coupled with the optical element provided on the opto-electric module portion; wherein a portion of the metal reinforcement layer present in the interconnection portion has a smaller width than a portion of the metal reinforcement layer present in the opto-electric module portion; wherein the portion of the metal reinforcement layer present in the interconnection portion has a discontinuity extending widthwise across the metal reinforcement layer.

According to a second inventive aspect, the discontinuity extending widthwise across the metal reinforcement layer is a discontinuity line including at least a discontinuity line portion extending longitudinally of the metal reinforcement layer or a discontinuity line portion extending obliquely with respect to a longitudinal direction of the metal reinforcement layer, and portions of the metal reinforcement layer separated widthwise of the metal reinforcement layer by the discontinuity line portion have a total width that is 0.8 to 1.2 times the width of a discontinuity absent portion of the smaller width portion of the metal reinforcement layer which is not formed with the discontinuity in the opto-electric hybrid board.

According to a third inventive aspect, the interconnection portion includes a second electric wiring in the opto-electric hybrid board. According to a fourth inventive aspect, the smaller width portion of the metal reinforcement layer has a rounded proximal corner portion in the opto-electric hybrid board.

In the present invention, the term "width" refers to a dimension measured perpendicularly to a longitudinal direction of the opto-electric hybrid board including a base of the elongated insulation layer as viewed in plan. The expression "a discontinuity extending widthwise (across the metal reinforcement layer)" means that the discontinuity is not necessarily required to be such that a discontinuity startpoint and a discontinuity endpoint are connected by the shortest path, i.e., by a single straight line extending perpendicularly to the longitudinal direction, but may extend along any of various detour paths across the longitudinally extending metal reinforcement layer.

In the inventive opto-electric hybrid board, the metal reinforcement layer is provided on the back surface of the base of the insulation layer as extending over the opto-electric module portion into the interconnection portion, and the portion of the metal reinforcement layer present in the interconnection portion has a smaller width. This arrangement makes it possible to reinforce the interconnection portion while imparting the interconnection portion with flexibility. Therefore, the opto-electric hybrid board is not badly folded or broken, even if the interconnection portion is bent or twisted. In addition, the portion of the metal reinforcement layer present in the interconnection portion has the discontinuity extending widthwise across the metal reinforcement layer. Therefore, where the opto-electric module portion is provided on each of opposite sides of the interconnection portion or another opto-electric module portion is connected to the interconnection portion via a connector, these opto-electric module portions are electrically isolated from each other because the metal reinforcement layer is divided by the discontinuity. Accordingly, the portions of the metal reinforcement layer serving as GNDs (grounds) in the respective opto-electric module portions are isolated from each other to separately function and, therefore, do not share noise. Thus, the opto-electric hybrid board is advantageous in that electric circuits provided in the respective opto-electric module portions are less liable to be adversely influenced.

Particularly, where the discontinuity of the metal reinforcement layer is the discontinuity line including at least the discontinuity line portion extending longitudinally of the metal reinforcement layer or the discontinuity line portion extending obliquely with respect to the longitudinal direction of the metal reinforcement layer and the portions of the metal reinforcement layer separated widthwise of the metal reinforcement layer by the discontinuity line portion have a total width that is 0.8 to 1.2 times the width of the discontinuity absent portion of the smaller width portion of the metal reinforcement layer, there is no significant difference in reinforcement width between the discontinuity present portion and the discontinuity absent portion of the metal reinforcement layer. Therefore, even if the interconnection portion is bent or twisted, the metal reinforcement layer is free from a local load, which may otherwise be exerted along the discontinuity thereof, to be thereby prevented from being folded or broken. Thus, the metal reinforcement layer can be advantageously maintained intact during prolonged use. Since the interconnection portion is not locally stressed, an optical waveguide provided along the interconnection portion is free from slight core warpage and the like. This makes it possible to further suppress the increase in the light transmission loss of the optical waveguide.

Particularly, where the second electric wiring is provided in the interconnection portion, a greater amount of information can be transmitted in the form of optical signals as well as in the form of electric signals and, therefore, this arrangement is advantageous.

Particularly, where the smaller width portion of the metal reinforcement layer has the rounded proximal corner portion, a stress exerted on the rounded portion is distributed along the rounded portion to be alleviated. Therefore, a step portion of the metal reinforcement layer formed due to a difference in width is prevented from being broken or badly folded, so that the metal reinforcement layer can be maintained intact during prolonged use. Since the interconnection portion is not locally stressed, the core of the optical waveguide provided along the interconnection portion is free from slight warpage and the like. This makes it possible to further suppress the increase in the light transmission loss of the optical waveguide.

DESCRIPTION OF EMBODIMENTS

Embodiments of the present invention will hereinafter be described in detail based on the drawings.

Figure 1:
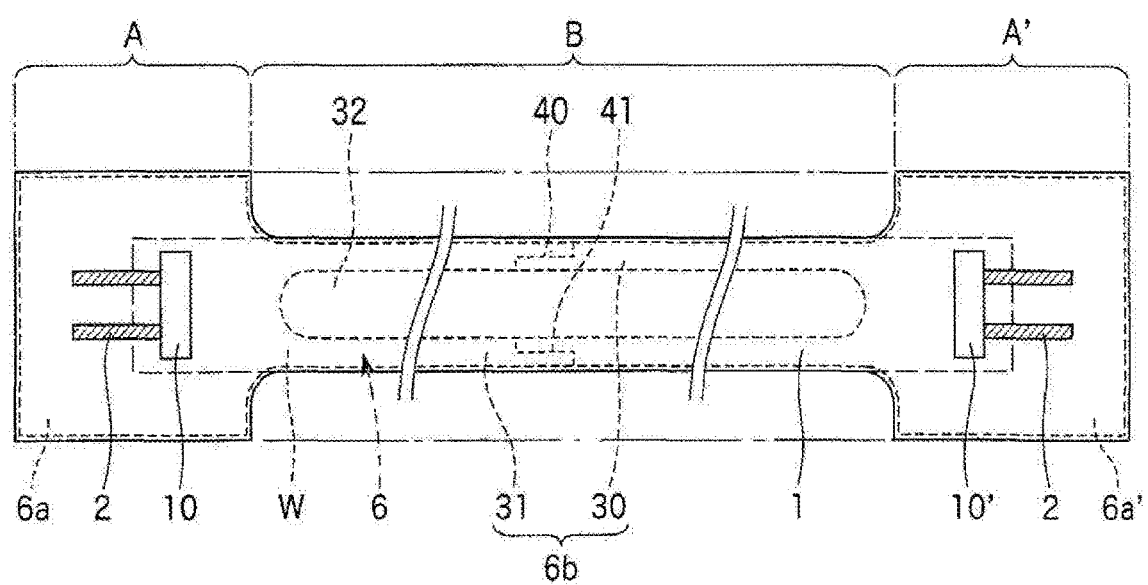
FIG. 1 is a schematic plan view illustrating an opto-electric hybrid board according to one embodiment of the present invention.
Figure 2A:
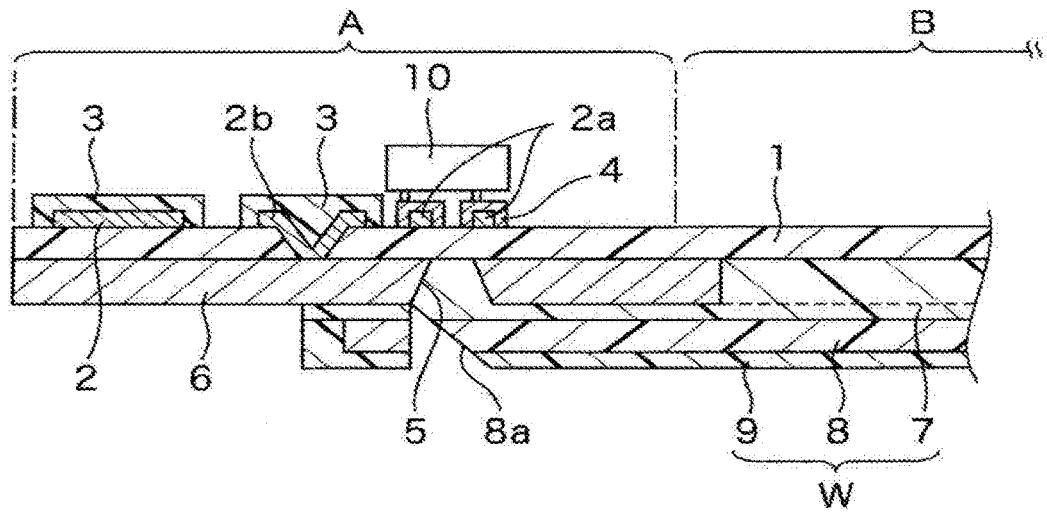
FIG. 2A is an explanatory diagram schematically illustrating a major portion of the opto-electric hybrid board in section on an enlarged scale.

FIG. 1 is a plan view schematically illustrating an opto-electric hybrid board according to one embodiment of the present invention, and FIG. 2A is an explanatory diagram schematically illustrating a major portion of the opto-electric hybrid board in section on an enlarged scale.

The opto-electric hybrid board includes a pair of left and right opto-electric module portions A, A' each having a generally square plan shape and an interconnection portion B provided between the opto-electric module portions A and A', and has an elongated shape as a whole. In the present invention, a component extending longitudinally is regarded as having an elongated shape even if having a widthwise projection. More specifically, the opto-electric hybrid board employs a unitary elongated insulation layer (in this embodiment, a transparent polyimide layer) 1 as a base, and the opto-electric module portions A, A' are respectively provided on front surfaces of left and right wider end portions of the insulation layer 1 and each include an optical element 10, 10' and a first electric wiring 2 of an electrically conductive pattern. In this embodiment, the optical element 10 of the opto-electric module portion A serves as a light receiving element which receives an optical signal and converts the optical signal to an electric signal. The optical element 10' of the opto-electric module portion A' serves as a light emitting element which receives an electric signal and converts the electric signal to an optical signal.

An optical waveguide W is provided on a back side of an elongated smaller width portion of the insulation layer 1 between the left and right opto-electric module portions A and A', and this smaller width portion serves for the interconnection portion B for transmitting optical signals. The opto-electric module portions A, A' may each further include an IC, an active element and the like for driving the optical element 10, 10' as required. In this embodiment, illustration and description of these elements will be omitted. The opto-electric module portions A, A' may each further include a connector for connection to another electric circuit board or the like. Since the opto-electric module portions A, A' basically have symmetrical structures, only the opto-electric module portion A will hereinafter be described and the description of the opto-electric module portion A' will be omitted.

In the opto-electric module portion A, the first electric wiring 2 is provided as having the predetermined electrically conductive pattern, which includes pads 2a for mounting the optical element 10 and a ground electrode 2b. The pads 2a each have a surface coated with a gold plating layer 4 for increasing the electrical conductivity thereof. A portion of the first electric wiring 2 other than the pads 2a is covered with a cover lay 3 to be protected for insulation (in FIG. 1, the cover lay 3 is not shown).

A metal reinforcement layer (in this embodiment, a stainless steel layer) 6 is provided on a back surface of the insulation layer 1 as extending over the opto-electric module portion A into the interconnection portion B so as to stably maintain the planarity of these portions. A reference numeral 5 designates a through-hole through which the optical element 10 is optically coupled with the optical waveguide W.

The metal reinforcement layer 6 will be described in greater detail. The metal reinforcement layer 6 includes a greater width portion 6a having an outer shape generally conformal to the outer shape of the opto-electric module portion A, and a smaller width portion 6b extending from one end of the greater width portion 6a into the interconnection portion B and having a smaller width like the width of the interconnection portion B. The optical waveguide W is provided below the metal reinforcement layer 6. Only the contour of the optical waveguide W is shown by a broken line in FIG. 1.

The smaller width portion 6b of the metal reinforcement layer 6 includes two elongated portions 30, 31 extending along opposite longitudinal side edges of the interconnection portion B, and has a slit 32 defined between the elongated portions 30 and 31 (in FIG. 1, the through-hole 5 for the optical coupling is not shown). The two elongated portions 30, 31 each have a rounded proximal corner portion connected to the greater width portion 6a and a rounded proximal corner portion defined by the slit 32. With the provision of these rounded proximal corner portions, stresses exerted on the interconnection portion B are distributed along the rounded proximal corner portions to be alleviated without concentrating on a flexible portion of the interconnection portion B, even if the interconnection portion B is bent or twisted to be stretched directly by the opto-electric module portion A imparted with higher rigidity by the metal reinforcement layer 6. This makes it possible to maintain the interconnection portion B intact during prolonged use, while preventing a certain region of the interconnection portion B from being torn, badly folded or broken.

Figure 2B:
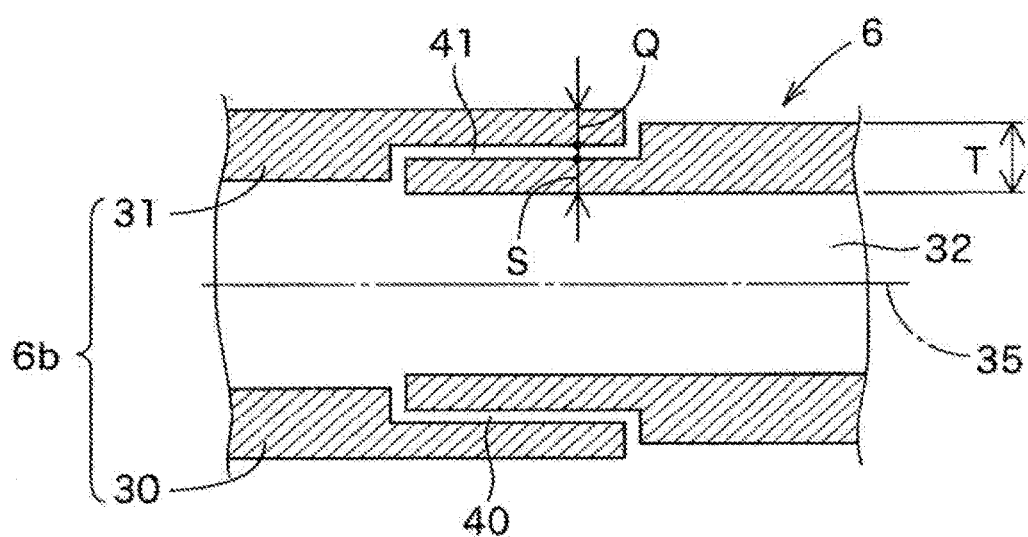
FIG. 2B is a schematic diagram for explaining the configuration of a metal reinforcement layer in the embodiment described above.

Further, the two elongated portions 30, 31 respectively have linear discontinuities 40, 41 provided in longitudinally middle portions thereof. The discontinuities 40, 41 divide the longitudinally extending metal reinforcement layer 6 into left and right portions, which are electrically isolated from each other. As shown in FIG. 2B which illustrates the metal reinforcement layer 6 provided on the back surface of the insulation layer 1 on an enlarged scale, the discontinuities 40, 41 each include discontinuity portions extending perpendicularly to a longitudinal direction of the elongated portion 30, 31 and a discontinuity portion extending longitudinally of the elongated portion 30, 31, and are symmetrical with respect to a center line 35 (symmetry axis) extending longitudinally of the interconnection portion B. Thus, the discontinuities 40, 41 respectively provided in the elongated portions 30, 31 divide the metal reinforcement layer 6 into the left and right portions, which are isolated from each other in the interconnection portion B. The left and right portions of the metal reinforcement layer 6 independently function as the grounds and, therefore, are prevented from sharing noise.

The discontinuities 40, 41 are each a fine discontinuity line including a longitudinally extending discontinuity line portion. Portions of the elongated portion 30, 31 separated widthwise of the elongated portion 30, 31 by the discontinuity line portion have a total width ((Q+S) in FIG. 2B) that is generally equal to the width T of a portion of the elongated portion 30, 31 not formed with the discontinuity 40, 41. Thus, the interconnection portion B is reinforced at any longitudinal position with the elongated portions 30, 31 each having substantially the same reinforcement width. Advantageously, the discontinuities 40, 41 do not trigger the breakage or the folding of the interconnection portion B, even if the interconnection portion B is bent or twisted.

On the back side of the insulation layer 1 (referring back to FIG. 2A), on the other hand, the optical waveguide W extends from the interconnection portion B, and a distal end portion of the optical waveguide W is optically coupled with the optical element 10 provided on the front side of the insulation layer 1 via the through-hole 5 of the metal reinforcement layer 6. More specifically, the optical waveguide W includes an under-cladding layer 7, a core 8 including a plurality of core portions arranged parallel to each other below the under-cladding layer 7, and an over-cladding layer 9 covering the core 8. The under-cladding layer 7, the core 8 and the over-cladding layer 9 are provided in this order downward from the back side of the insulation layer 1. The under-cladding layer 7 partly enters the through-hole 5 into contact with the metal reinforcement layer 6.

Therefore, the opto-electric hybrid board is freely bendable with excellent flexibility. In addition, even if the opto-electric module portions A, A' and the interconnection portion B are brought into a significantly bent positional relationship to be stretched or twisted, stresses occurring due to the stretching or the twisting can be uniformly distributed along the rounded portions (the rounded proximal corner portions of the smaller width portion 6b) of the metal reinforcement layer 6 connected to the interconnection portion B to be thereby alleviated. Further, the discontinuities 40, 41 respectively provided in the elongated portions 30, 31 in the interconnection portion B divide the metal reinforcement layer 6 into the left and right portions, which are isolated from each other and independent of each other. Therefore, the left and right opto-electric module portions A, A' do not share noise through the left and right portions of the metal reinforcement layer 6 functioning as the grounds, so that electric circuits of the opto-electric module portions A, A' are less liable to be adversely influenced. In addition, the discontinuities 40, 41 respectively provided in the elongated portions 30, 31 are fine discontinuity lines. Thus, consideration is given so that the discontinuities 40, 41 hardly trigger the breakage and the folding of the smaller width portion 6b of the metal reinforcement layer 6. Therefore, the flexibility and the durability of the opto-electric hybrid board are not impaired. Since the interconnection portion B is not locally stressed, the core 8 of the optical waveguide W provided along the interconnection portion B is free from slight warpage and the like. This makes it possible to suppress the increase in the light transmission loss of the optical waveguide W.

The opto-electric hybrid board may be produced, for example, in the following manner.

Figure 3A:
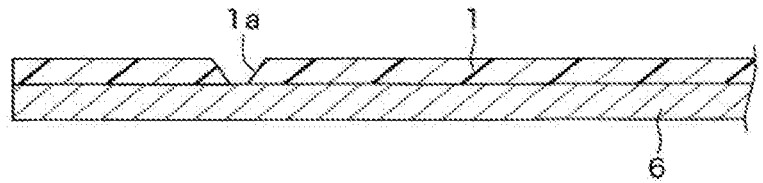
FIGS. 3A to 3E are schematic diagrams for explaining an opto-electric module portion fabricating step in a production method for the opto-electric hybrid board.

First, as shown in FIG. 3A, a flat elongated metal reinforcement layer 6 is prepared. Exemplary materials for the metal reinforcement layer 6 include stainless steel, copper, silver, aluminum, nickel, chromium, titanium, platinum and gold, among which stainless steel is preferred for strength and bendability. The metal reinforcement layer 6 preferably has a thickness, for example, in a range of 10 to 70 μm. If the metal reinforcement layer 6 is excessively thin, it will be impossible to sufficiently provide the opto-electric hybrid board reinforcing effect. If the metal reinforcement layer 6 is excessively thick, on the other hand, the metal reinforcement layer is liable to have an excessively high rigidity. Therefore, the opto-electric hybrid board is liable to have poorer bendability, greater bulkiness, and poorer handleability with an excessively great overall thickness.

Then, a photosensitive insulative resin such as containing a polyimide resin is applied onto a surface of the metal reinforcement layer 6, and formed into an insulation layer 1 of a predetermined pattern by a photolithography process. In this embodiment, a hole 1a through which the surface of the metal reinforcement layer 6 is partly exposed is formed at a predetermined position in the insulation layer 1 for formation of a ground electrode 2b in contact with the metal reinforcement layer 6. The insulation layer 1 preferably has a thickness in a range of 3 to 50 μm.

Figure 3B:
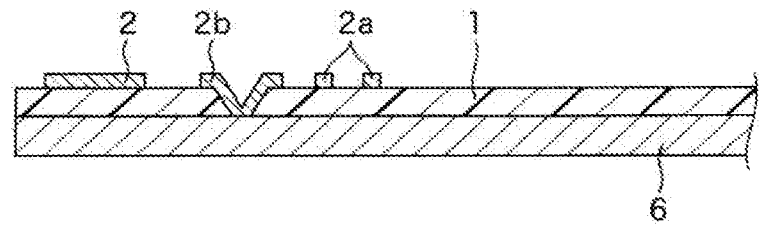

In turn, as shown in FIG. 3B, a first electric wiring 2 (including pads 2a for mounting an optical element 10, and the ground electrode 2b) for an opto-electric module portion A is simultaneously formed, for example, by a semi-additive method. In this method, a metal film (not shown) such as a copper film is formed on a surface of the insulation layer 1 by sputtering or electroless plating. The metal film serves as a seed layer (a base layer for formation of an electro-plating layer) in the subsequent electro-plating step. Subsequently, a photosensitive resist (not shown) is applied to both surfaces of a stack including the metal reinforcement layer 6, the insulation layer 1 and the seed layer, and then holes for an electrically conductive pattern of the first electric wiring 2 are formed in a photosensitive resist layer present on the seed layer by a photolithography process. Thus, surface portions of the seed layer are exposed in bottoms of the holes.

In turn, an electro-plating layer of an electrically conductive material such as copper is formed on the surface portions of the seed layer exposed in the bottoms of the holes by electro-plating. Then, the photosensitive resist is lifted off with a sodium hydroxide aqueous solution. Thereafter, a portion of the seed layer not formed with the electro-plating layer is removed by soft etching. Remaining portions of a stack of the seed layer and the electro-plating layer serve as the first electric wiring 2. Preferred examples of the electrically conductive material include highly electrically conductive and highly ductile metal materials such as chromium, aluminum, gold and tantalum in addition to copper. Other preferred examples of the electrically conductive material include alloys containing at least one of these metals. The first electric wiring 2 preferably has a thickness in a range of 3 to 30 µm. If the thickness of the first electric wiring 2 is smaller than the aforementioned range, the first electric wiring 2 is liable to have poorer electric wiring properties. If the thickness of the first electric wiring 2 is greater than the aforementioned range, on the other hand, the opto-electric module portion A is liable to have an excessively great overall thickness including the thickness of the metal reinforcement layer 6 provided on the back side thereof and, hence, have greater bulkiness.

Figure 3C:
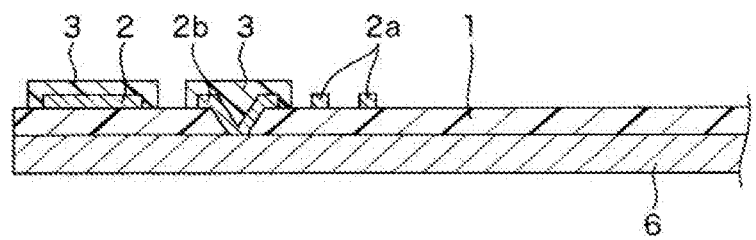

Subsequently, as shown in FIG. 3C, an electroless plating layer (not shown) such as a nickel layer is formed on a surface of the first electric wiring 2 in the opto-electric module portion A, and then a photosensitive insulative resin such as a resin containing a polyimide resin is applied and patterned by a photolithography process to form a cover lay 3 on a portion of the first electric wiring 2 other than the optical element mounting pads 2a. The cover lay 3 preferably has a thickness in a range of 1 to 20 µm. Where the thickness of the cover lay 3 falls within this range, the cover lay 3 can effectively protect and reinforce the first electric wiring 2.

Figure 3D:
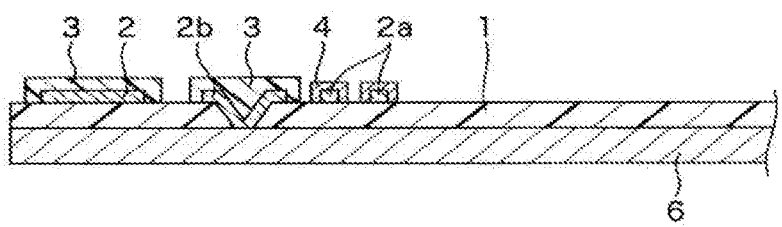

In turn, as shown in FIG. 3D, parts of the electroless plating layer (not shown) present on the pads 2a of the first electric wiring 2 are removed by etching, and then an electro-plating layer such as a gold or nickel layer (in this embodiment, a gold-plating layer) 4 is formed on the pads 2a from which the electroless plating layer has been removed.

Subsequently, a photosensitive resist (not shown) is applied to both surfaces of a stack of the metal reinforcement layer 6 and the insulation layer 1, and then holes are formed in a photosensitive resist layer present on the back surface of the metal reinforcement layer 6 (opposite from that formed with the first electric wiring 2) as corresponding to parts of the metal reinforcement layer 6 to be removed (for a slit 32 and discontinuities 40, 41 in an interconnection portion B, and light path through-holes) by a photolithography process. Thus, parts of the back surface of the metal reinforcement layer 6 are exposed in the holes.

Figure 3E:
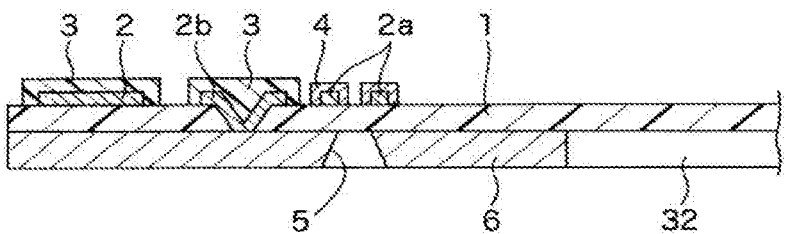

Then, as shown in FIG. 3E, the parts of the metal reinforcement layer 6 exposed in the holes are removed by etching with the use of an etching aqueous solution suitable for the material for the metal reinforcement layer 6 (with the use of a ferric chloride aqueous solution, for example, where the metal reinforcement layer 6 is a stainless steel layer), whereby the insulation layer 1 is exposed from the removed parts. Thereafter, the photosensitive resist layer is lifted off with the use of a sodium hydroxide aqueous solution. Thus, the metal reinforcement layer 6 is configured to extend over the back surfaces of the opto-electric module portions A, A' and include two elongated portions 30, 31 extending between opposite end portions of the interconnection portion B and respectively having the discontinuities 40, 41 as shown in FIG. 1.

Figure 4A:
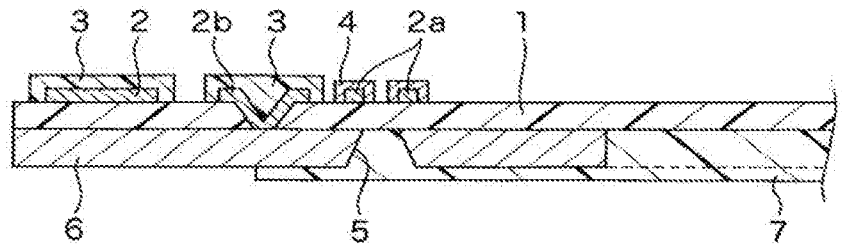
FIGS. 4A to 4D are schematic diagrams for explaining an interconnection portion fabricating step in the opto-electric hybrid board production method.

Subsequently, an optical waveguide W (see FIG. 2A) is fabricated on the back surfaces of the insulation layer 1 and the metal reinforcement layer 6. More specifically, as shown in FIG. 4A, a photosensitive resin as a material for an under-cladding layer 7 is first applied on the back surfaces (lower surfaces in FIG. 4A) of the insulation layer 1 and the metal reinforcement layer 6, and then the resulting layer is cured by exposure to radiation. Thus, the under-cladding layer 7 is formed. The under-cladding layer 7 preferably has a thickness in a range of 3 to 50 µm (as measured from the back surface of the metal reinforcement layer 6). The under-cladding layer 7 may be patterned in a predetermined pattern by a photolithography process.

Figure 4B:
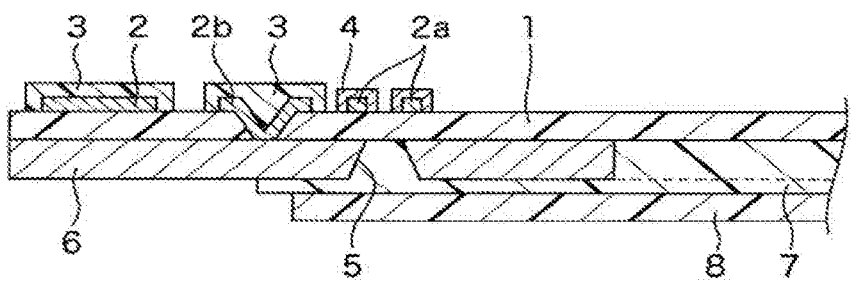

Then, as shown in FIG. 4B, a core 8 is formed in a predetermined pattern on a surface (a lower surface in FIG. 4B) of the under-cladding layer 7 by a photolithography process. The core 8 preferably has a thickness in a range of 20 to 100 µm. The core 8 preferably has a width in a range of 10 to 100 µm. An exemplary material for the core 8 is the same type of photosensitive resin as the under-cladding layer 7, but has a higher refractive index than the materials for the under-cladding layer 7 and an over-cladding layer 9 to be described later (see FIG. 4C). The refractive index may be controlled in consideration of the selection of the types of the materials and the formulations of the materials for the under-cladding layer 7, the core 8 and the over-cladding layer 9.

Figure 4C:
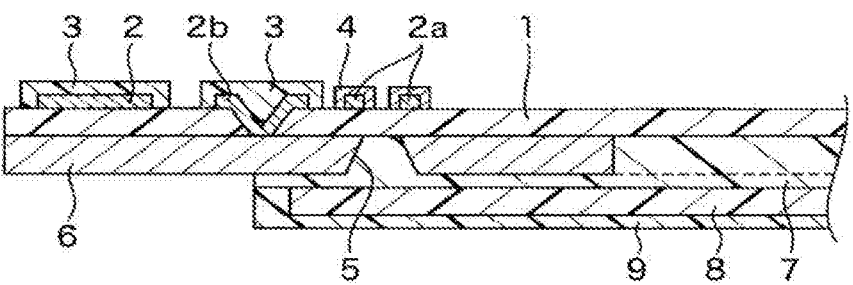

Subsequently, as shown in FIG. 4C, the over-cladding layer 9 is formed over a surface (a lower surface in FIG. 4C) of the under-cladding layer 7 by a photolithography process to cover the core 8. The over-cladding layer 9 has a greater thickness than the core 8, i.e., preferably has a thickness of not greater than 300 µm (as measured from the surface of the under-cladding layer 7). An exemplary material for the over-cladding layer 9 is the same type of photosensitive resin as the under-cladding layer 7. For the formation of the over-cladding layer 9, the photosensitive resin may be patterned into a predetermined pattern by a photolithography process.

Figure 4D:
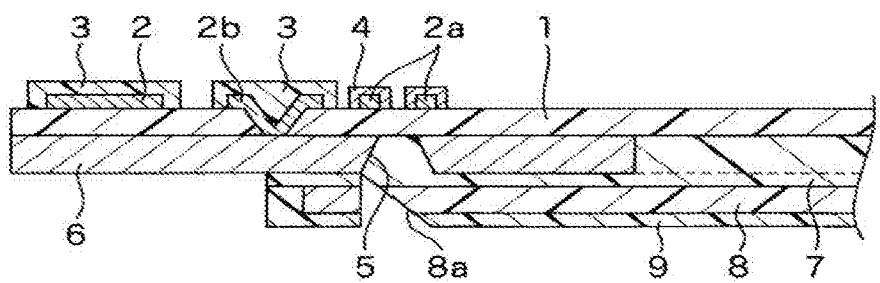

Then, as shown in FIG. 4D, a light reflecting surface 8a inclined at 45 degrees with respect to a longitudinal direction of the core 8 is formed in a portion of the optical waveguide W (each end portion of the optical waveguide W as seen in FIG. 2A) associated with the pads 2a provided on the front surface of the insulation layer 1 by a laser processing method, a cutting method or the like. Then, an optical element 10 is mounted on the pads 2a. Thus, an intended opto-electric hybrid board is provided.

In the production method described above, the pads 2a of the first electric wiring 2 for mounting the optical element 10 are covered with the gold plating layer 4, but the coverage with the plating layer is not necessarily required depending on the material for the first electric wiring 2 and the required properties of the first electric wiring 2.

In the embodiment described above, the opto-electric module portions A, A' are provided integrally on left and right sides of the interconnection portion B. However, it is not necessarily required to provide the left and right opto-electric module portions A, A' in pair, but only one of the opto-electric module portions may be provided. In this case, a distal end of the interconnection portion B may be connected to another opto-electric module portion via a connector or the like.

Figure 5A:
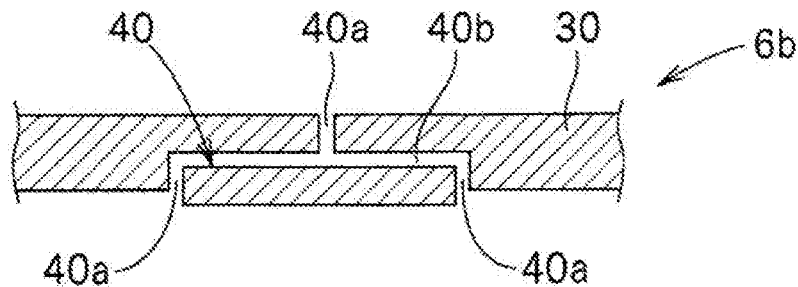
FIGS. 5A to 5C are explanatory diagrams showing modifications of the metal reinforcement layer as seen in plan.
Figure 5B:
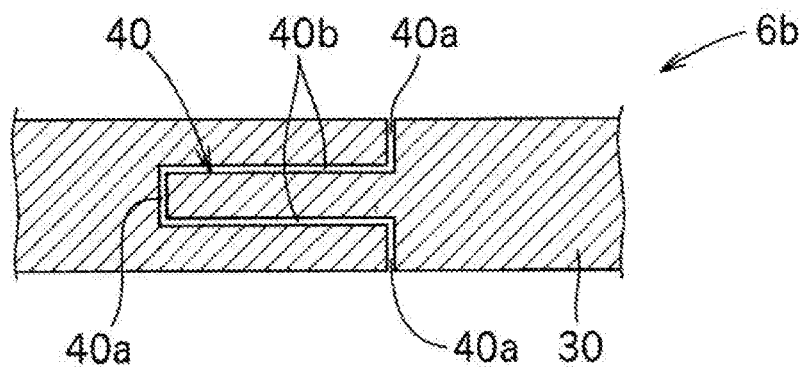

The configurations of the discontinuities 40, 41 respectively provided in the two elongated portions 30, 31 of the smaller width portion 6b of the metal reinforcement layer 6 are not limited to those of the embodiment described above, but may have other patterns. Other exemplary patterns for the discontinuities 40, 41 are shown in FIGS. 5A and 5B. Since the elongated portions 30, 31 are generally disposed symmetrically with respect to the center line 35 of the interconnection portion B (see FIG. 2B), only the elongated portion 30 will be described and the description of the other elongated portion 31 will be omitted.

Referring to FIG. 5A, the discontinuity 40 dividing the elongated portion 30 into the left and right portions to isolate the left and right portions from each other includes three discontinuity portions 40a perpendicular to the longitudinal direction of the elongated portion 30 and one discontinuity portion 40b extending longitudinally of the elongated portion 30. In this embodiment, the discontinuity 40 has a very small width and, therefore, the interconnection portion B can be reinforced at any longitudinal position with a discontinuity present portion and a discontinuity absent portion of the elongated portion 30 having substantially the same reinforcement width. Even if the interconnection portion B is repeatedly bent, the discontinuity 40 hardly triggers the breakage and the folding of the interconnection portion B.

Referring to FIG. 5B, the discontinuity 40 dividing the elongated portion 30 into the left and right portions to isolate the left and right portions from each other includes three discontinuity portions 40a perpendicular to the longitudinal direction of the elongated portion 30 and two discontinuity portions 40b extending longitudinally of the elongated portion 30. In this embodiment, the discontinuity 40 has a very small width and, as in the previous embodiment, the interconnection portion B can be reinforced at any longitudinal position with a discontinuity present portion and a discontinuity absent portion of the elongated portion 30 having substantially the same reinforcement width. Even if the interconnection portion B is repeatedly bent, the discontinuity 40 hardly triggers the breakage and the folding of the interconnection portion B. Of course, the discontinuity 40 may include only one discontinuity portion provided in a middle portion of the elongated portion 30.

Figure 5C:
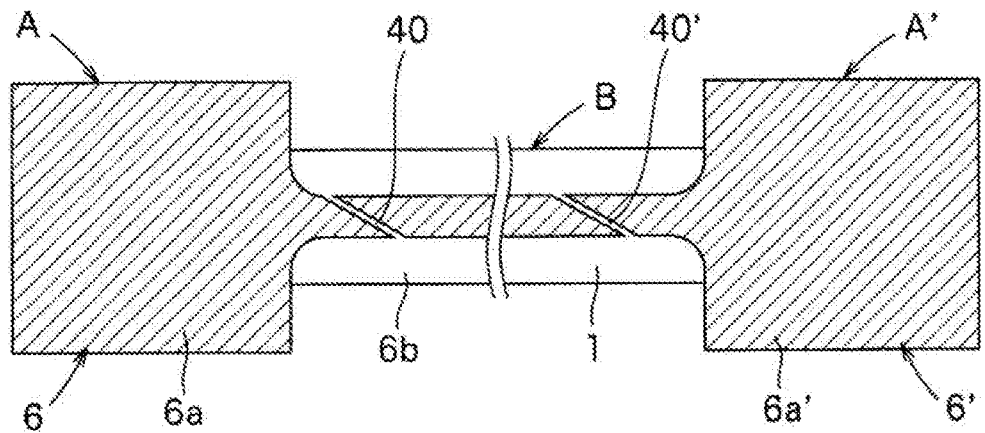

Referring to FIG. 5C, the smaller width portion 6b of the metal reinforcement layer 6 for the interconnection portion B may include a single elongated portion having a smaller width, rather than the two elongated portions 30, 31 in the previous embodiments, and may have two discontinuities 40, 40' provided at left and right positions thereof. With this arrangement, the metal reinforcement layer 6 is divided into three regions including left and right regions and a middle region to isolate these regions from each other.

The discontinuities 40, 40' may each include discontinuity portions perpendicular to the longitudinal direction of the elongated metal reinforcement layer 6 and a discontinuity portion extending longitudinally of the metal reinforcement layer 6 as in FIGS. 5A and 5B, or may each extend obliquely across the metal reinforcement layer 6 as in FIG. 5C.

Figure 6A:
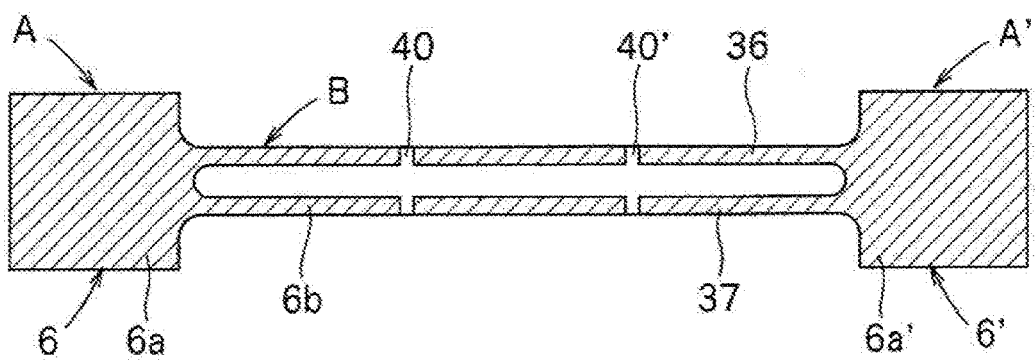
FIGS. 6A to 6C are explanatory diagrams showing further other modifications of the metal reinforcement layer as seen in plan.

The discontinuities 40, 40' are not necessarily required to include the longitudinally extending portion or to extend obliquely. For example, as shown in FIG. 6A, the smaller width portion 6b of the metal reinforcement layer 6 for the interconnection portion B may include two elongated portions 36, 37 extending longitudinally of the interconnection portion B and each having two discontinuities 40, 40' provided in a middle portion thereof as extending perpendicularly across the elongated portion 36, 37.

Figure 6B:
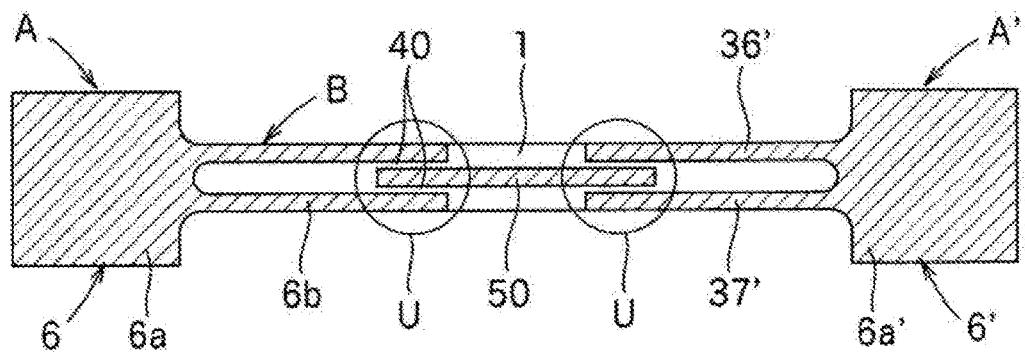
Figure 6C:
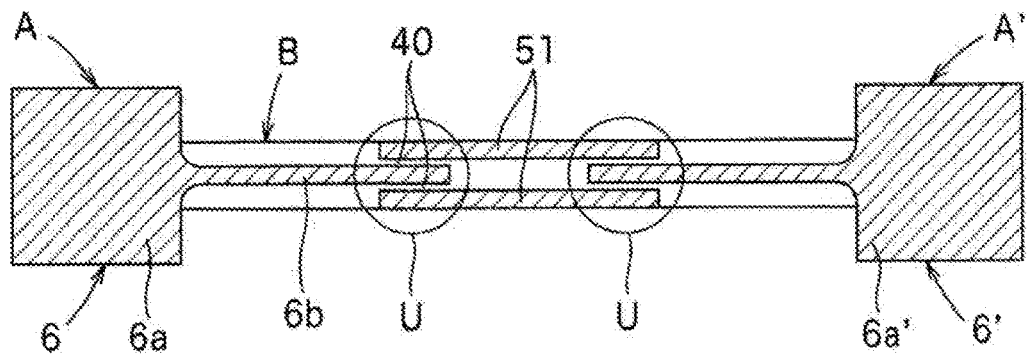
Figure 7A:
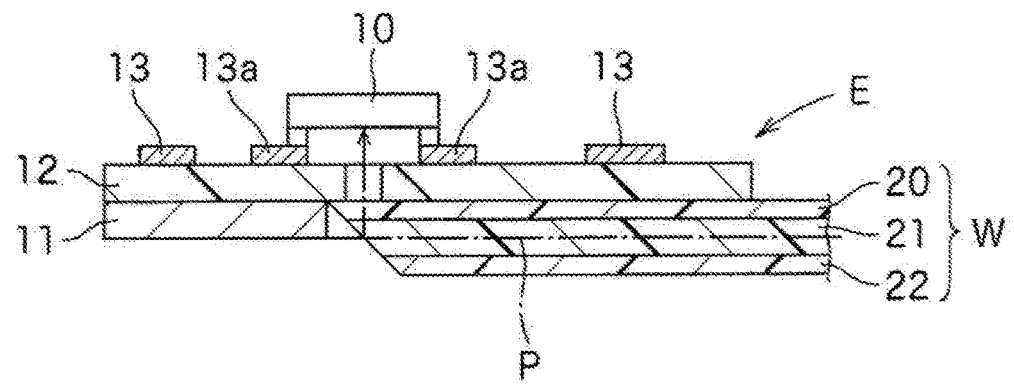
FIG. 7A is a longitudinal sectional view schematically illustrating an exemplary conventional opto-electric hybrid board.
Figure 7B:
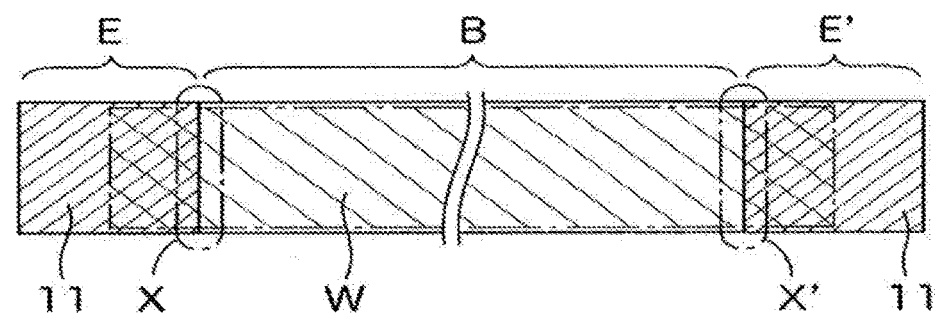
FIG. 7B is a schematic plan view for explaining a problem associated with the conventional opto-electric hybrid board.
Figure 7C:
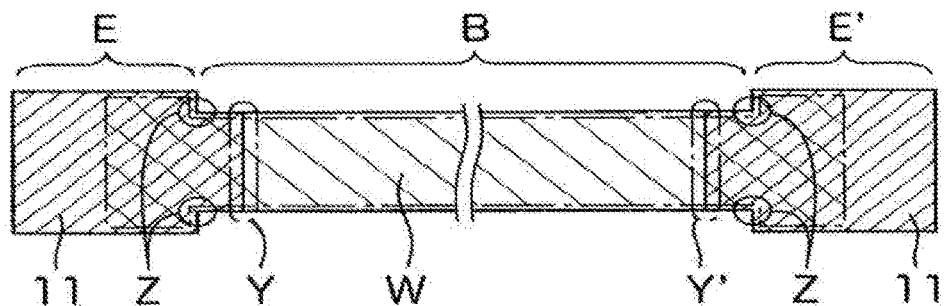
FIG. 7C is a schematic plan view for explaining a problem associated with another conventional opto-electric hybrid board having a different configuration.
Figure 8:
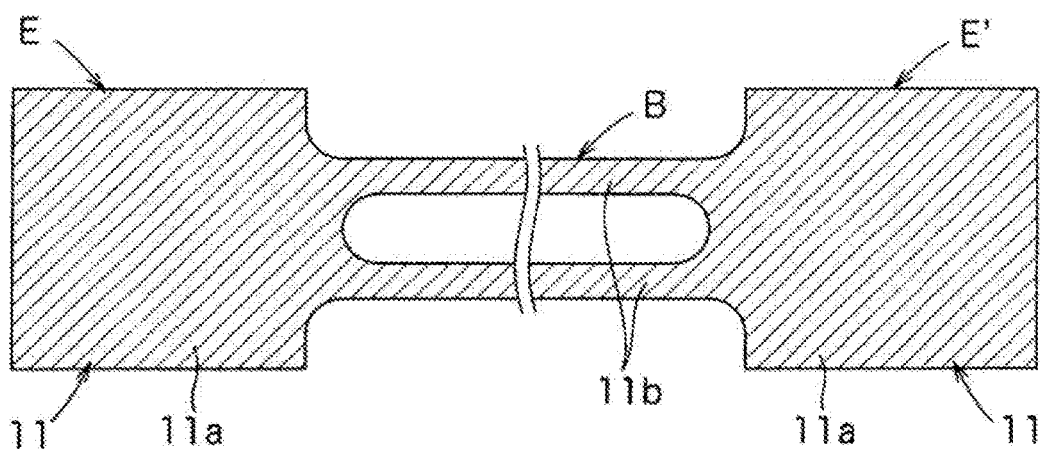
FIG. 8 is an explanatory diagram illustrating an exemplary metal reinforcement layer as seen in plan according to the previous patent application.

Another conceivable exemplary configuration of the metal reinforcement layer 6 is such that the smaller width portion 6b includes two elongated portions 36', 37' extending longitudinally of the interconnection portion B and each having a discontinuity, and an auxiliary elongated portion 50 provided in a middle portion of the interconnection portion B as extending longitudinally of the interconnection portion B as shown in FIG. 6B. Further another conceivable configuration of the metal reinforcement layer 6 is such that the smaller width portion 6b includes a single elongated portion having a discontinuity, and two auxiliary elongated portions 51 provided along opposite side edges of a middle portion of the interconnection portion B as extending longitudinally of the interconnection portion B as shown in FIG. 6C in contrast to that shown in FIG. 6B. With these configurations, two longitudinally extending discontinuities 40 isolate left and right portions of the metal reinforcement layer 6 from each other in encircled regions U. Therefore, these configurations are effective in that the electric circuits of the left and right opto-electric module portions A, A' (see FIG. 1) are less liable to be adversely influenced by noise. However, a difference in the widthwise occupying ratio of the metal reinforcement layer 6 between the region having the discontinuities 40 and the other region is excessively great. Therefore, the breakage and the folding of the interconnection portion B are disadvantageously liable to be triggered at boundaries between the encircled regions U and the other region when the interconnection portion B is repeatedly bent or twisted.

In the embodiments of the present invention, therefore, the discontinuities 40, 41, 40' provided for the isolation of the left and right portions of the metal reinforcement layer 6 desirably each have a sufficiently small width as compared with the width of the overall metal reinforcement layer. That is, the discontinuities 40, 41, 40' are desirably fine discontinuity lines which desirably each include at least a discontinuity line portion extending longitudinally of the metal reinforcement layer 6 or a discontinuity line portion extending obliquely with respect to the longitudinal direction of the metal reinforcement layer 6. More specifically, portions of the metal reinforcement layer 6 separated widthwise of the metal reinforcement layer 6 by the longitudinally extending discontinuity line portion preferably have a total width (Q+S) that is 0.8 to 1.2 times the width T of the discontinuity absent portion of the metal reinforcement layer 6 not formed with the discontinuity 40, 41, 40'} (see FIG. 2B). This is advantageous in that the interconnection portion B can be reinforced at any longitudinal position with the discontinuity present portion and the discontinuity absent portion having substantially the same reinforcement width.

In the embodiments described above, the smaller width portion and the elongated portions 30, 31 of the metal reinforcement layer 6 each have a rounded proximal corner portion so as to prevent the stresses from concentrating on a flexible portion of the interconnection portion B. However, these proximal corner portions are not necessarily required to be rounded. Where the use application or the mounting state of the opto-electric hybrid board is such that a greater load is applied to the interconnection portion B or the interconnection portion B is repeatedly bent, it is desirable to round the proximal corner portions of the metal reinforcement layer 6.

In the embodiments described above, the interconnection portion B provided between the left and right opto-electric module portions A and A' is narrower than the opto-electric module portions A, A', and the metal reinforcement layer 6 is configured corresponding to this configuration to include the greater width portions 6a respectively provided on the back side of the left and right opto-electric module portions A, A' and the smaller width portion 6b provided on the back side of the narrower interconnection portion B. Alternatively, as indicated by a one-dot-and-dash line in FIG. 1, the opto-electric hybrid board may entirely have an elongated shape having a constant width, and only a portion of the metal reinforcement layer 6 present on the back side of the interconnection portion B may be configured to serve as the smaller width portion 6b. In this case, it is possible to provide the same effects as in the aforementioned embodiments.

In the embodiments described above, the interconnection portion B is configured to include only the optical waveguide W, but may be configured to include a second electric wiring as well as the optical waveguide W.

EXAMPLES

Example 1

The opto-electric hybrid board shown in FIGS. 1, 2A and 2B was produced by the aforementioned production method. The interconnection portion B had a length of 20 cm. A 20-μm thick stainless steel layer was provided as the metal reinforcement layer 6. The rounded proximal corner portions of the smaller width portion 6b of the metal reinforcement layer 6 each had a curvature radius of 1.5 mm. The two elongated portions 30, 31 (see FIG. 2B) each had a width T of 400 μm, and the discontinuities 40, 41 each had a width of 100 μm. Since the portions of the elongated portions 30, 31 separated widthwise from each other had a total width (Q+S) of 400 μm, the ratio T:(Q+S)=1:1. The insulation layer 1 had a thickness of 5 μm, and the under-cladding layer 7 had a thickness of 10 μm (as measured from the back surface of the insulation layer 1). The core 8 had a thickness of 50 μm and a width of 50 μm. The over-cladding layer 9 had a thickness of 70 μm (as measured from the surface of the under-cladding layer 7). The first electric wiring 2 had a thickness of 5 μm.

Comparative Example 1

An opto-electric hybrid board was produced in substantially the same manner as in Example 1, except that the discontinuities 40, 41 were not provided in the metal reinforcement layer 6.

[Breaking Strength]

The opto-electric hybrid boards of Example 1 and Comparative Example 1 were each twisted widthwise one turn and, in this state, longitudinally stretched. Then, the stretching load was increased, and a stretching load (breaking strength) was measured when the interconnection portion B was broken. As a result, the opto-electric hybrid boards of Example 1 and Comparative Example 1 each had a breaking strength of 12 N. Although the metal reinforcement layer 6 had the discontinuities 40, 41 in the opto-electric hybrid board of Example 1, the breaking strength was not reduced.

While a specific form of the embodiments of the present invention has been shown in the aforementioned inventive example, the inventive example is merely illustrative of the invention but not limitative of the invention. It is contemplated that various modifications apparent to those skilled in the art could be made within the scope of the invention.

The inventive opto-electric hybrid board can be widely used for a variety of electronic devices required to have flexibility, particularly for image display devices and mobile communication devices for consumer use, and for inspection apparatuses for industrial and medical use which are each required to have a smaller size and a higher information processing capability.

REFERENCE SIGNS LIST

1: INSULATION LAYER
2: FIRST ELECTRIC WIRING
6: METAL REINFORCEMENT LAYER
10, 10': OPTICAL ELEMENT
40, 41: DISCONTINUITY
A, A': OPTO-ELECTRIC MODULE PORTION
B: INTERCONNECTION PORTION

The invention claimed is:

1. An opto-electric hybrid board comprising:
an elongated insulation layer;
an opto-electric module portion defined on at least one end portion of the insulation layer;
an elongated interconnection portion defined on a portion of the insulation layer extending from the opto-electric module portion; and
a metal reinforcement layer provided on a back surface of the insulation layer in the opto-electric module portion and in the interconnection portion;
wherein the opto-electric module portion includes a first electric wiring of an electrically conductive pattern provided on a front side thereof, and an optical element provided on the front side thereof;
wherein an elongated optical waveguide is provided on a back side of the interconnection portion and is optically coupled with the optical element provided on the opto-electric module portion;
wherein a portion of the metal reinforcement layer present in the interconnection portion has a smaller width than a portion of the metal reinforcement layer present in the opto-electric module portion; and
wherein the portion of the metal reinforcement layer present in the interconnection portion has a discontinuity extending widthwise across the metal reinforcement layer so as to separate the metal reinforcement layer in a longitudinal direction.

2. The opto-electric hybrid board according to claim 1, wherein the discontinuity extending widthwise across the metal reinforcement layer is a discontinuity line including at least a discontinuity line portion extending longitudinally of the metal reinforcement layer or a discontinuity line portion extending obliquely with respect to a longitudinal direction of the metal reinforcement layer; and
wherein portions of the metal reinforcement layer separated widthwise of the metal reinforcement layer by the discontinuity line portion have a total width that is 0.8 to 1.2 times a width of a portion of the metal reinforcement layer which is present in the interconnection portion and which is not formed with the discontinuity.

3. The opto-electric hybrid board according to claim 1, wherein the interconnection portion includes a second electric wiring.

4. The opto-electric hybrid board according to claim 1, wherein the metal reinforcement layer has a rounded corner portion where the portion of the metal reinforcement layer present in the interconnection portion meets the portion of the metal reinforcement layer present in the opto-electric module portion.

5. The opto-electric hybrid board according to claim 1, wherein an inner side of the portion of the metal reinforcement layer present in the interconnection portion has an elongated oval slit extending longitudinally.

6. The opto-electric hybrid board according to claim 1, wherein the portion of the metal reinforcement layer present in the interconnection portion includes two elongated portions extending longitudinally.

7. The opto-electric hybrid board according to claim 1, wherein the opto-electric module portion is defined on both end portions of the elongated insulation layer, and
wherein the portion of the metal reinforcement layer present in the interconnection portion includes two elongated portions extending longitudinally and disconnected in a middle portion of the interconnection portion; and an auxiliary elongated portion extending longitudinally in the middle portion of the interconnection portion.

8. The opto-electric hybrid board according to claim 1, wherein the opto-electric module portion is defined on both end portions of the elongated insulation layer, and
wherein the portion of the metal reinforcement layer present in the interconnection portion includes a single elongated portion extending longitudinally and disconnected in a middle portion of the interconnection portion; and two elongated portions extending longitudinally in the middle portion of the interconnection portion so as to interpose the disconnected portion of the single elongated portion.

* * * * *